United States Patent
Jhong et al.

(10) Patent No.: US 11,302,545 B2
(45) Date of Patent: Apr. 12, 2022

(54) SYSTEM AND METHOD FOR CONTROLLING SEMICONDUCTOR MANUFACTURING EQUIPMENT

(71) Applicant: NANYA TECHNOLOGY CORPORATION, New Taipei (TW)

(72) Inventors: Jheng-Ting Jhong, Taoyuan (TW); Wei-Pin Lin, Taoyuan (TW); Ching-Mao Huang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 117 days.

(21) Appl. No.: 16/825,889

(22) Filed: Mar. 20, 2020

(65) Prior Publication Data

US 2021/0296148 A1  Sep. 23, 2021

(51) Int. Cl.
*H01L 21/67* (2006.01)
*G05B 13/04* (2006.01)
*G05B 13/02* (2006.01)

(52) U.S. Cl.
CPC .... *H01L 21/67276* (2013.01); *G05B 13/0265* (2013.01); *G05B 13/042* (2013.01); *G05B 13/048* (2013.01)

(58) Field of Classification Search
CPC .. G03F 7/70433; G03F 7/70441; G03F 7/705; G03F 7/70508; G03F 7/70525; G03F 7/70616; G03F 7/70633; G03F 7/70641; G03F 7/7065; G05B 13/0265; G05B 13/042; G05B 13/048; G05B 23/0294; G05B 2219/45031; H01L 21/67276; H01L 22/10
See application file for complete search history.

(56) References Cited

U.S. PATENT DOCUMENTS 6,128,403 A * 10/2000 Ozaki ................ H01L 22/20
                                                    382/145
6,658,640 B2 * 12/2003 Weed ................ G03F 7/705
                                                    716/52
(Continued)

FOREIGN PATENT DOCUMENTS

TW      200415453 A      8/2004
TW      200424816 A      11/2004
(Continued)

*Primary Examiner* — Crystal J Barnes-Bullock
(74) *Attorney, Agent, or Firm* — Muncy, Geissler, Olds & Lowe, P.C.

(57) ABSTRACT

The present disclosure provides a system and a method for controlling semiconductor manufacturing equipment. The system includes a sensor, a sensor interface, and an analysis unit. The sensor provides a sensor signal. The sensor interface receives the sensor signal and generates an input signal for a database server. A front-end subsystem receives the input signal from the database server and performs a comparison process to generate a data signal. A calculation subsystem performs an artificial intelligence analytical process to generate an optimal parameter set and a simulated result map according to the data signal. A message and tuning subsystem generates an alert signal and a feedback signal according to the optimal parameter set and the simulated result map, and the message and tuning subsystem transmits the alert message to a user of the semiconductor manufacturing equipment.

20 Claims, 11 Drawing Sheets

(56) References Cited

U.S. PATENT DOCUMENTS

| | | | | |
|---|---|---|---|---|
| 6,668,360 | B1* | 12/2003 | Liu | G06F 30/398 |
| | | | | 716/106 |
| 7,123,980 | B2* | 10/2006 | Funk | G05B 23/0264 |
| | | | | 700/121 |
| 7,363,099 | B2* | 4/2008 | Smith | H01L 21/31053 |
| | | | | 700/121 |
| 9,070,622 | B2* | 6/2015 | Ke | G03F 7/70633 |
| 9,696,150 | B2* | 7/2017 | Matsuoka | G01B 15/00 |
| 10,012,900 | B2* | 7/2018 | Kim | G03F 7/70616 |
| 10,546,085 | B2* | 1/2020 | Hu | G03F 7/70433 |
| 10,777,470 | B2* | 9/2020 | Cheong | G01R 31/2831 |
| 10,957,031 | B1* | 3/2021 | Wu | G06T 7/0004 |
| 10,997,340 | B2* | 5/2021 | Hu | G03F 7/70433 |
| 2007/0105243 | A1* | 5/2007 | Nagatomo | H01L 22/12 |
| | | | | 438/14 |
| 2011/0246141 | A1* | 10/2011 | Li | G01B 21/24 |
| | | | | 703/2 |
| 2020/0096876 | A1* | 3/2020 | Lin | H01J 37/3174 |
| 2020/0159177 | A1* | 5/2020 | Salsbury | G05B 19/042 |
| 2020/0294829 | A1* | 9/2020 | Machavariani | G01N 23/04 |
| 2020/0363778 | A1* | 11/2020 | Mahapatra | H05B 6/6464 |
| 2021/0041788 | A1* | 2/2021 | Van Oosten | G03F 1/68 |
| 2021/0042570 | A1* | 2/2021 | Iskandar | G06F 11/3089 |
| 2021/0247438 | A1* | 8/2021 | Lin | G08B 29/04 |

FOREIGN PATENT DOCUMENTS

| | | |
|---|---|---|
| TW | 200527172 A | 8/2005 |
| TW | 200949752 A | 12/2009 |
| TW | 201639175 A | 11/2016 |
| TW | 201735210 A | 10/2017 |
| TW | 201739951 A | 11/2017 |
| TW | 201810485 A | 3/2018 |
| TW | 201827962 A | 8/2018 |
| TW | 201933616 A | 8/2019 |
| TW | 201945996 A | 12/2019 |

* cited by examiner

SYSTEM AND METHOD FOR CONTROLLING SEMICONDUCTOR MANUFACTURING EQUIPMENT

TECHNICAL FIELD

The present disclosure relates to a system and a method for controlling equipment, and more particularly, to a system and a method for controlling semiconductor manufacturing equipment.

DISCUSSION OF THE BACKGROUND

The semiconductor industry has undergone rapid growth due to improvements in integration density. Semiconductor manufacturing equipment such as etching tools generally requires constant tuning of process parameters in order to optimize etch uniformity. However, manual inspection and tuning of the etching tools using techniques such as optical critical-dimension mapping often results in lost processing time and defective products due to human error. Accordingly, systems and methods for controlling the equipment need to be effective in providing optimized process parameters, simulation of predicted results, and advanced warning of equipment tuning.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a system for controlling semiconductor manufacturing equipment, including a sensor, a sensor interface, and an analysis unit. The sensor provides at least one sensor signal representative of the semiconductor manufacturing equipment. The sensor interface receives the at least one sensor signal and generates at least one input signal for a database server. The analysis unit includes a front-end subsystem, a calculation subsystem, and a message and tuning subsystem. The front-end subsystem receives the at least one input signal from the database server and performs a comparison process to generate a data signal. The calculation subsystem receives the data signal from the front-end subsystem, wherein the calculation subsystem performs an artificial intelligence (AI) analytical process to generate an optimal parameter set and a simulated result map according to the data signal. The message and tuning subsystem generates an alert signal and a feedback signal according to the optimal parameter set and the simulated result map, wherein the message and tuning subsystem transmits the alert message to a user of the semiconductor manufacturing equipment.

In some embodiments, the front-end subsystem comprises an extract-transform-load (ETL) module for comparing the at least one input signal to at least one threshold value and generating the data signal according to whether the at least one input signal is within a range of the at least one threshold value, or whether the at least one input signal exceeds the at least one threshold value.

In some embodiments, the calculation subsystem generates the optimal parameter set and the simulated result map according to the data signal by extracting an input parameter set, calculating one or more height, depth, distance, and/or mask values at each data point, performing a statistical model prediction for each data point, and determining a predicted result.

In some embodiments, the at least one input signal comprises at least one set of timing, wafer size, and capacitance parameters.

In some embodiments, the at least one input signal comprises at least one set of timing, wafer size, and radial assembly dial parameters.

In some embodiments, the message and tuning subsystem transmits the feedback signal for an automated tuning process of the semiconductor manufacturing equipment according to the optimal parameter set and the simulated result map.

In some embodiments, the semiconductor manufacturing equipment comprises one or more etching tools.

Another aspect of the present disclosure provides a system for monitoring semiconductor manufacturing equipment, wherein the system includes a sensor, a sensor interface, one or more processors, and one or more computer-readable non-transitory storage media. The sensor provides at least one sensor signal representative of the semiconductor manufacturing equipment. The sensor interface receives the at least one sensor signal and generates at least one input signal for a database server. The one or more computer-readable non-transitory storage media are coupled to the one or more processors and include instructions operable when executed by the one or more processors to cause the system to: receive the at least one input signal from the database server and perform a comparison process to generate a data signal; receive the data signal from the front-end subsystem, wherein the calculation subsystem performs an artificial intelligence (AI) analytical process to generate an optimal parameter set and a simulated result map according to the data signal; generate an alert signal and a feedback signal according to the optimal parameter set and the simulated result map; and transmit the alert message to a user of the semiconductor manufacturing equipment.

In some embodiments, the one or more computer-readable non-transitory storage media further comprise instructions operable when executed by the one or more processors to cause the system to perform extract-transform-load (ETL) services, compare the at least one input signal to at least one threshold value, and generate the data signal according to whether the at least one input signal is within a range of the at least one threshold value, or whether the at least one input signal exceeds the threshold value.

In some embodiments, the optimal parameter set and the simulated result map are generated according to the data signal by extracting an input parameter set, calculating one or more height, depth, distance, and/or mask values at each data point, performing a statistical model prediction for each data point, and determining a predicted result.

In some embodiments, the at least one input signal comprises at least one set of timing, wafer size, and capacitance parameters.

In some embodiments, the at least one input signal comprises at least one set of timing, wafer size, and radial assembly dial parameters.

In some embodiments, the one or more computer-readable non-transitory storage media further comprise instructions operable when executed by the one or more processors to cause the system to transmit the feedback signal for an automated tuning process of the semiconductor manufacturing equipment according to the optimal parameter set and the simulated result map.

In some embodiments, the semiconductor manufacturing equipment comprises one or more etching tools.

Another aspect of the present disclosure provides a method for controlling semiconductor manufacturing equipment, including: providing, by a sensor, at least one sensor signal representative of the semiconductor manufacturing equipment; receiving, by a sensor interface, the at least one sensor signal and generating at least one input signal for a database server; receiving, by a front-end subsystem, the at least one input signal from the database server and performing a comparison process to generate a data signal; receiving, by a calculation subsystem, the data signal from the front-end subsystem and performing an artificial intelligence (AI) analytical process to generate an optimal parameter set and a simulated result map according to the data signal; and generating, by a message and tuning subsystem, an alert signal and a feedback signal according to the optimal parameter set and the simulated result map, wherein the message and tuning subsystem transmits the alert message to a user of the semiconductor manufacturing equipment.

In some embodiments, the method further comprises comparing, by an extract-transform-load (ETL) module of the front-end subsystem, the at least one input signal to at least one threshold value and generating the data signal according to whether the at least one input signal is within a range of the at least one threshold value, or whether the at least one input signal exceeds the at least one threshold value.

In some embodiments, the method further comprises generating, by the calculation subsystem, the optimal parameter set and the simulated result map according to the data signal by extracting an input parameter set, calculating one or more height, depth, distance, and/or mask values at each data point, performing a statistical model prediction for each data point, and determining a predicted result.

In some embodiments, the at least one input signal comprises at least one set of timing, wafer size, and capacitance parameters.

In some embodiments, the at least one input signal comprises at least one set of timing, wafer size, and radial assembly dial parameters.

In some embodiments, the method further comprises transmitting, by the message and tuning subsystem, the feedback signal for an automated tuning process of the semiconductor manufacturing equipment according to the optimal parameter set and the simulated result map, wherein the semiconductor manufacturing equipment comprises one or more etching tools.

Accordingly, the systems and the methods for controlling semiconductor manufacturing equipment provide automated AI analytical subsystems and processes capable of predicting the optimized process parameters of equipment such as etching tools. Due to the analysis unit, which includes the intelligent calculation subsystem and the message and tuning subsystem, operators of the etching tool can monitor and optimize the process parameters of the equipment and receive advanced warning regarding the status of the process parameters. Moreover, due to the automated parameter optimization and equipment tuning of such systems and methods, human error, processing time, and defective products can be minimized.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
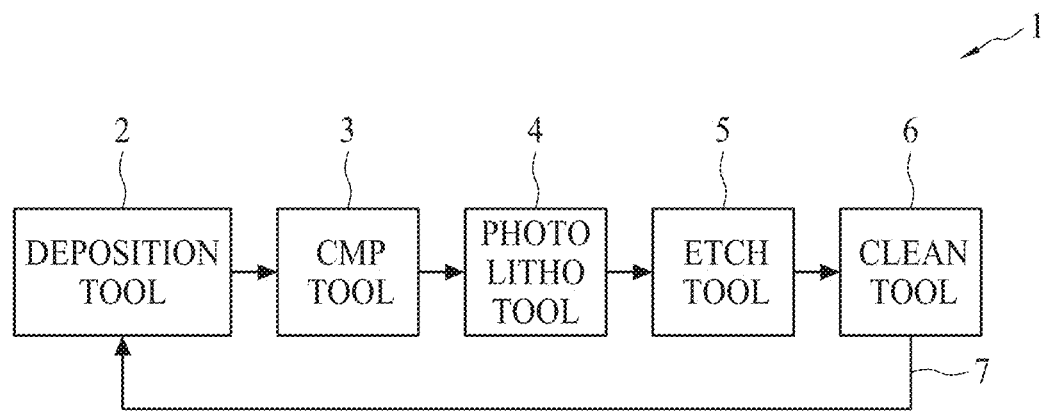
FIG. 1 is a block diagram of a semiconductor fabrication facility according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

To describe film-forming or deposition processes, the term "deposition" will generally be used herein for consistency. For film removal, the term "etch" will be used, and for a cleaning removal process, the term "clean" will be used. The figures may use other designations as applicable for illustrative clarity or convenience.

FIG. 1 is a block diagram of a semiconductor fabrication facility 1 according to some embodiments of the present disclosure. With reference to FIG. 1, the semiconductor fabrication facility 1 may include a plurality of semiconductor manufacturing tools such as a deposition tool 2, a chemical mechanical polishing (CMP) tool 3, a photolithography tool 4, an etching tool 5, and a cleaning tool. Typically, a design of microelectronic devices to be formed in a wafer is produced, and a layout is made from the design. The layout may include sets of patterns that will be transferred to one or more stacked layers of materials that are applied to the wafer during its fabrication in a process sequence 7 to form the various circuits and devices on the substrate of the wafer. According to some embodiments, the process sequence 7 of the semiconductor fabrication facility 1 shown in FIG. 1 is an exemplary process flow which may be used several times to deposit or form films on a substrate of the wafer and pattern them using a variety of lithography and etch techniques. Such general fabrication steps may include a deposition process using the deposition tool 2, a planarization and/or polishing process using the CMP tool 3, an exposure process with a patterned wavelength of light using the photolithography tool 4, a removal process of the exposed portions of the film using the etching tool 5, and a cleaning process using the cleaning tool 6 in preparation for subsequent processing. It should be noted that other steps in addition to deposition, planarization, photolithography, etching, and cleaning may be utilized in the semiconductor fabrication facility 1 as would be understood by a person of ordinary skill in the art. Moreover, each of the steps of a deposition, planarization, photolithography, etching, and cleaning process may include various specific steps. Therefore, the process sequence 7 depicted in FIG. 1 should not be construed as limiting with respect to embodiments of the present disclosure. In some embodiments, examples of the deposition techniques used in the deposition tool 2 may include chemical vapor deposition (CVD), electrochemical deposition (ECD), physical vapor deposition (PVD), molecular beam epitaxy (MBE), atomic layer deposition (ALD), self-assembled monolayer (SAM) deposition and others. In some embodiments, the deposition techniques may be complemented by the creation of plasma so as to suitably affect the chemical reactivity of the processes occurring at the substrate surface.

Figure 2:
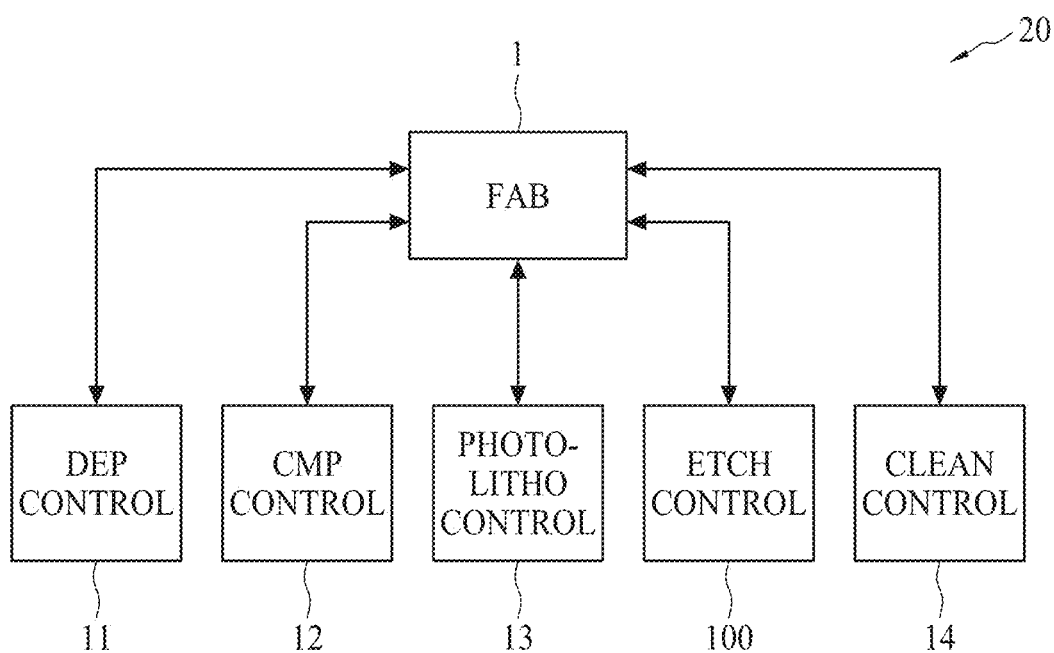
FIG. 2 is a block diagram of a control platform of a semiconductor fabrication facility according to some embodiments of the present disclosure.

FIG. 2 is a block diagram of a control platform 20 of the semiconductor fabrication facility 1 according to some embodiments of the present disclosure. With reference to FIG. 1 and FIG. 2, the control platform 20 includes a plurality of systems for controlling and monitoring the fabrication tools of the semiconductor fabrication facility 1. The control platform 20 may include a system 11 for controlling the deposition tool 2, a system 12 for controlling the CMP tool 3, a system 13 for controlling the photolithography tool 4, a system 100 for controlling the etching tool 5, and a system 14 for controlling the cleaning tool 6. In some embodiments, measurement or metrology data may be captured to control and optimize the fabrication processes performed by the fabrication tools of the semiconductor fabrication facility 1. For instance, the system 100 may include a plurality of subsystems to control and monitor various parameters and settings in order to optimize the performance of the etching tool 5 of FIG. 1, as described later in embodiments of the present disclosure.

Figure 3:
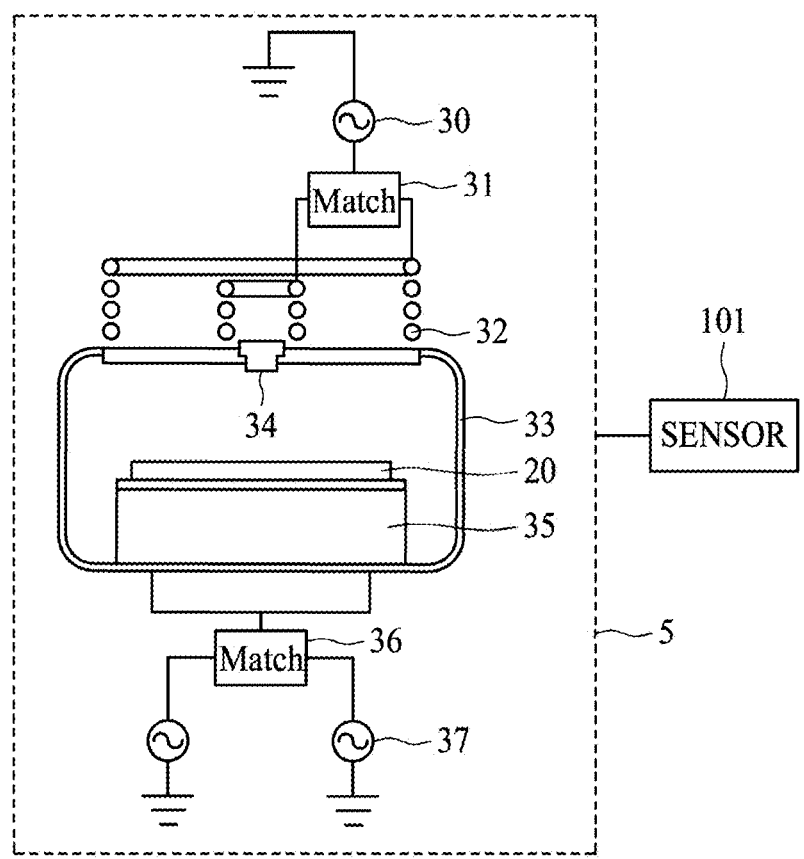
FIG. 3 is a schematic view of an etching tool according to some embodiments of the present disclosure.

FIG. 3 is a schematic view of the etching tool 5 according to some embodiments of the present disclosure. With reference to FIG. 3, the etching tool 5 removes material selectively on the surface of a wafer 20 in order to create patterns thereon. The material may be selectively removed by wet etching (i.e., chemical etching), dry etching (i.e., chemical etching and/or physical etching), or other types of etching. The etching tool 5 shown in FIG. 3 uses an example of dry etching referred to as plasma etching, although other types of etching tool 5 may be used according to the particular application. The etching tool 5 includes a power supply 30, a first radio frequency (RF) match network 31, a plurality of coils 32, a chamber 33, a process gas 34, an electrostatic chuck 35, a second RF match network 36, and a bias power source 37. A sensor 101 is coupled to the etching tool 5, and the sensor 101 may include a plurality of probes and other measurement tools to provide at least one sensor signal representative of the etching tool 5. As described later in the present disclosure, in some embodiments, the data collected by the sensor 101 may be used by the control system 100 to optimize the etching process of the etching tool 5. The power supply 30 of the etching tool 5 may be an RF power generator operating at 13.56 MHz, and the bias power source 36 may be a dual-frequency bias power source operating at 2 MHz and 13 MHz, for example, although other types of power supply 30 and bias power source 36 may be used according to the particular application of the etching tool 5. The etching tool 5 may also include controllers (not shown) for adjusting the coil current ratio, the RF plate height, the process gas 34, and the temperature of the electrostatic chuck 35, for example. In some embodiments, plasma etching performed by the etching tool 5 involves forming a plasma of an appropriate gas mixture depending on the type of film being etched, and the plasma is exposed to the wafer 20. The plasma may include charged species (ions and free electrons) and neutral species (atoms, molecules, and radicals) in the gas phase that kinetically interact with the substrate or layer of the wafer 20 to remove portions thereof, such as the portions exposed by a photolithography pattern.

Figure 4:
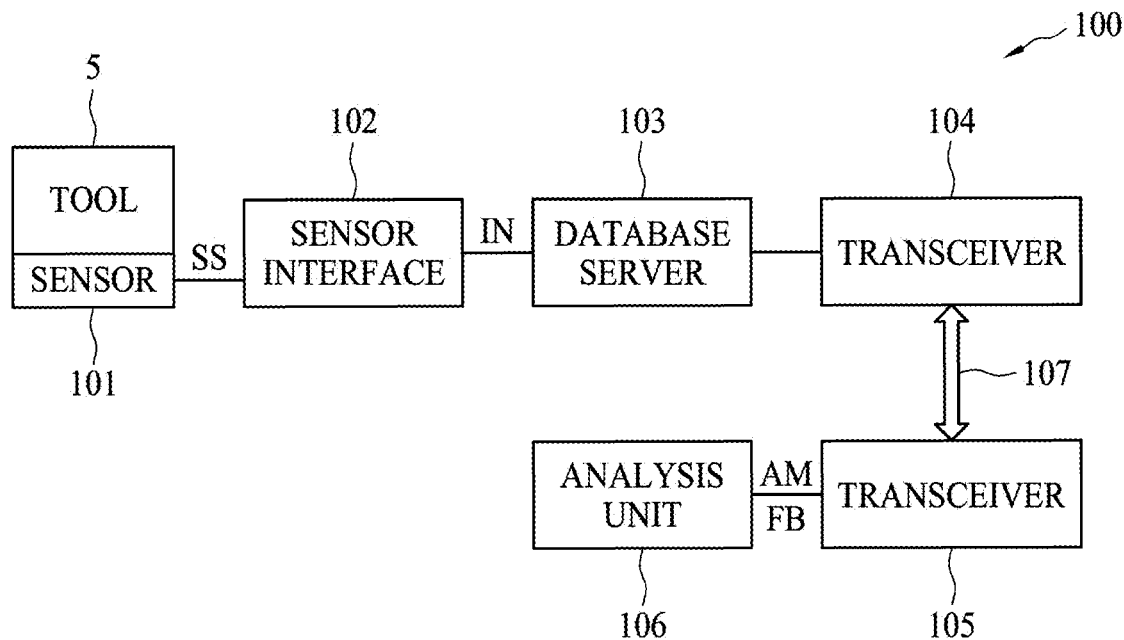
FIG. 4 is a block diagram of a system for controlling semiconductor manufacturing equipment according to some embodiments of the present disclosure.
Figure 5:
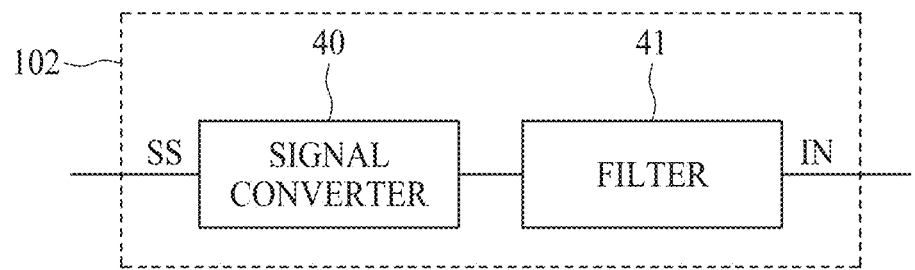
FIG. 5 is a block diagram of a sensor interface according to some embodiments of the present disclosure.
Figure 6:
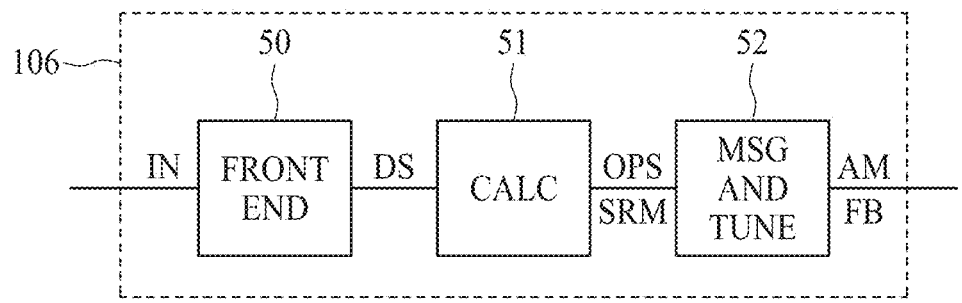
FIG. 6 is a block diagram of an analysis unit according to some embodiments of the present disclosure.

FIG. 4 is a block diagram of the system 100 for controlling semiconductor manufacturing equipment according to some embodiments of the present disclosure. FIG. 5 is a block diagram of a sensor interface 102 according to some embodiments of the present disclosure. FIG. 6 is a block diagram of an analysis unit 106 according to some embodiments of the present disclosure. With reference to FIG. 4 to FIG. 6, the system 100 for controlling the etching tool 5 includes the sensor 101, the sensor interface 102, a database server 103, a first transceiver 104, a second transceiver 105, and the analysis unit 106. In some embodiments, the semiconductor manufacturing equipment may include, for example, the etching tool 5 depicted in FIG. 3, although the general operating principles of the system 100 may be applied to other control systems in the control platform 20 of the semiconductor fabrication facility 1. The sensor 101 provides at least one sensor signal SS representative of the etching tool 5. In some embodiments, the sensor interface 102 receives the at least one sensor signal SS from the sensor 101 and generates at least one input signal IN for the database server 103, which may be a database server of a database warehouse, for example. The at least one input signal IN may be transmitted from the database server 103 by the first transceiver 104 to the second transceiver 105 through a network link 107. In some embodiments, the at least one input signal IN may be modulated when it is transmitted by the first transceiver 104 and demodulated when it is received by the second transceiver 105. The network link 107 may be any suitable type of network link based on wired or wireless technology known in the art, including but not limited to infrared, optical, or radio communication means. In some embodiments, the analysis unit 106 receives the at least one input signal IN and performs an artificial intelligence (AI) analytical process of the etching tool 5 to generate a feedback signal FB according to an optimal parameter set OPS and a simulated result map SRM. In some embodiments, the feedback signal FB from the analysis unit 106 is transmitted to the etching tool 5 through the network link 107 between the second transceiver 105 and the first transceiver 104. In some embodiments, the feedback signal FB may be modulated when it is transmitted by the second transceiver 105 and demodulated when it is received by the first transceiver 104.

With reference to FIG. 5, the sensor interface 102 includes one or more signal converters 40 and one or more filters 41. In some embodiments, the signal converters 40 may include analog-to-digital (A/D) converters, digital-to-analog (D/A) converters, or other suitable signal converters. When generating the input signal IN for the analysis unit 106, the signal converters 40 of the sensor interface 102 may convert the sensor signal SS from an analog signal to a digital signal, for example. The filters 41 may include anti-alias filters, low-pass filters, high-pass filters, band-pass filters, or other suitable filters for the particular application of the system 100 for controlling the etching tool 5. The filters 41 may be used to improve the signal-to-noise ratio of the input signal IN, for instance. In some embodiments, the feedback signal FB may be converted by the signal converters 40 into a compatible format and filtered by the filters 41 before being transmitted to the etching tool 5.

With reference to FIG. 6, the analysis unit 106 includes a front-end subsystem 50, a calculation subsystem 51, and a message and tuning subsystem 52. In some embodiments, the front-end subsystem 50 receives the at least one input signal IN from the database server 103 and performs a comparison process to generate a data signal DS. The calculation subsystem 51 receives the data signal DS from the front-end subsystem 50, and the calculation subsystem 51 performs the AI analytical process to generate the optimal parameter set OPS and the simulated result map SRM according to the data signal DS. The message and tuning subsystem 52 generates an alert signal AM and the feedback signal FB according to the optimal parameter set OPS and the simulated result map SRM, and the message and tuning subsystem transmits the alert signal AM to a user of the etching tool 5.

Figure 7:
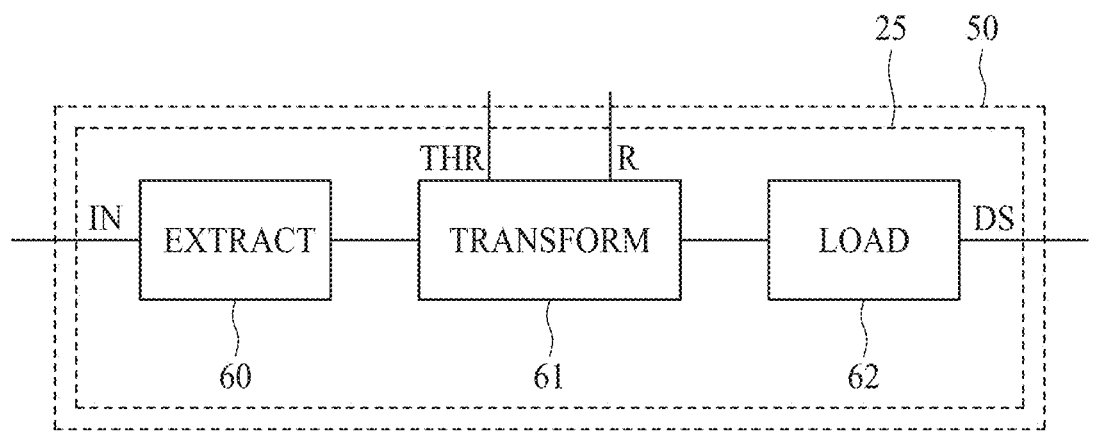
FIG. 7 is a block diagram of a front-end subsystem according to some embodiments of the present disclosure.

FIG. 7 is a block diagram of the front-end subsystem 50 according to some embodiments of the present disclosure. With reference to FIG. 7, the front-end subsystem 50 may include an extract-transform-load (ETL) module 25 for comparing the at least one input signal IN to at least one threshold value THR and generating the data signal DS according to whether the at least one input signal IN is within a range R of the at least one threshold value THR, or whether the at least one input signal IN exceeds the at least one threshold value THR. In some embodiments, as shown in FIG. 7, the ETL module 25 includes an extract block 60, a transform block 61, and a load block 62. In some embodiments, the extract block 60 may unpack and extract the at least one input signal IN. The transform block 61 may perform the comparison process between the at least one input signal IN and the at least one threshold value THR, as well as other suitable data integrity and confirmation procedures. The load block 62 may generate and load the data signal DS according to the comparison process performed by the transform block 61, such that the calculation subsystem 51 is able to use the data signal DS for the AI analytical process.

Figure 8:
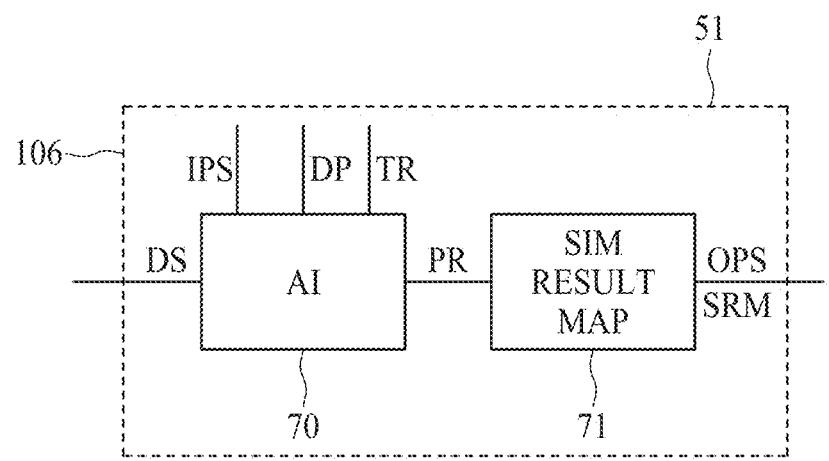
FIG. 8 is a block diagram of a calculation subsystem according to some embodiments of the present disclosure.

FIG. 8 is a block diagram of the calculation subsystem 51 according to some embodiments of the present disclosure. With reference to FIG. 8, the calculation subsystem 51 includes an AI analysis module 70 and a simulated result mapping module 71. In some embodiments, the calculation subsystem 51 generates the optimal parameter set OPS and the simulated result map SRM according to the data signal DS by extracting an input parameter set IPS, calculating one or more wafer height, depth, distance, and/or mask values at each data point DP, performing a statistical model prediction for each data point DP, and determining a predicted result PR. In some embodiments, the statistical model prediction performed by the AI analysis module 70 for each data point DP includes using a training data TR in an AI regression analysis (e.g., deep learning regression analysis) of the input parameter set IPS at each data point DP. The data points DP may be data points of metrology data captured by the sensor 101 and stored in the database server 103 of FIG. 4. The simulated result map SRM is generated based on the statistical model prediction performed by the AI analysis module 70 and the predicted result PR, and the simulated result map SRM includes graphical hot zone simulations of the predicted result PR of various parameter variations of the input parameter set IPS. It should be noted that the statistical model prediction and other AI analytical processes performed by the AI analysis module 70 may include other machine learning algorithms and techniques, standard regression analysis algorithms and techniques, or a combination thereof.

Figure 9A:
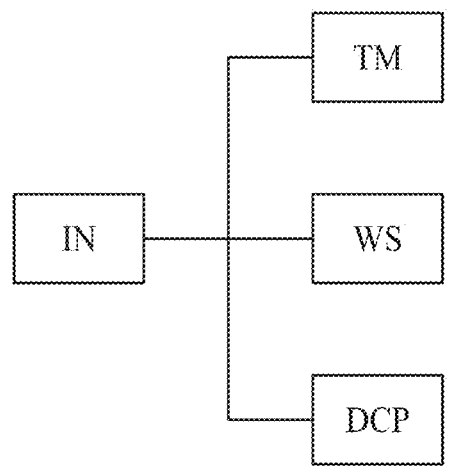
FIG. 9A is a relational diagram showing a relationship between at least one input signal and components thereof according to some embodiments of the present disclosure.
Figure 9B:
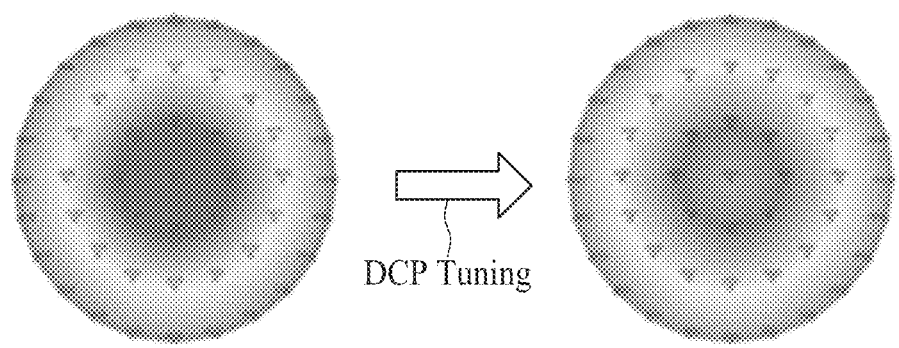
FIG. 9B is a schematic diagram of a divider capacitor etch tuning according to some embodiments of the present disclosure.

FIG. 9A is a relational diagram showing a relationship between the at least one input signal IN and components thereof according to some embodiments of the present disclosure. FIG. 9B is a schematic diagram of a divider capacitor etch tuning according to some embodiments of the present disclosure. With reference to FIG. 9A and FIG. 9B, in some embodiments, the at least one input signal IN includes at least one set of timing parameters TM, wafer size parameters WS, and divider capacitance parameters DCP. As shown in FIG. 9B, in some embodiments, divider capacitor etch tuning may be used to adjust center to edge etch rate uniformity of the etching tool 5, so as to mitigate the macro-loading effects of silicon wafer loss. For example, as seen in FIG. 9B, by decreasing the value of the capacitance parameters DCP, a center etch rate may be increased due to the current increase of the coils 32 placed in an inner region of the etching tool 5 depicted in FIG. 3.

Figure 10A:
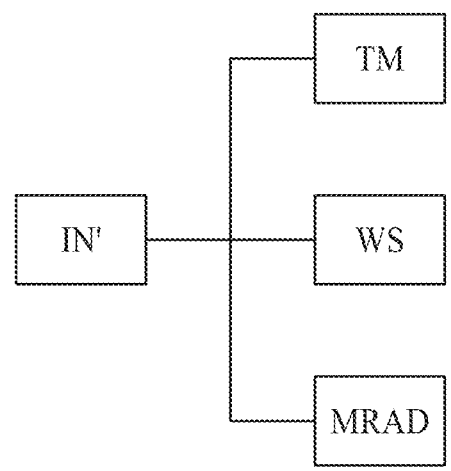
FIG. 10A is a relational diagram showing a relationship between at least one input signal and components thereof according to some embodiments of the present disclosure.
Figure 10B:
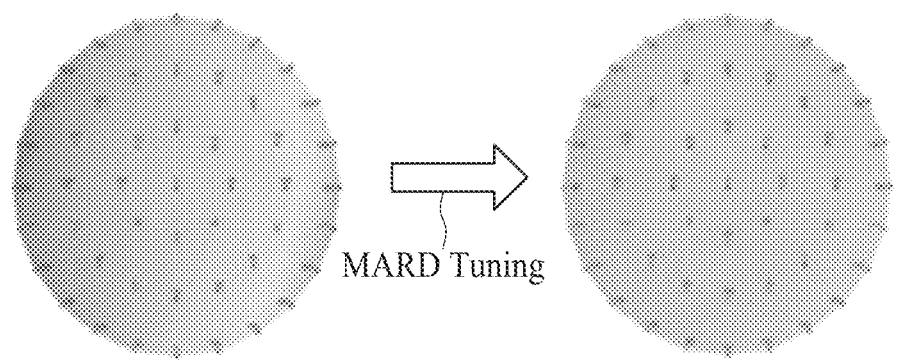
FIG. 10B is a schematic diagram of a motorized radio frequency (RF) assembly dial etch tuning according to some embodiments of the present disclosure.

FIG. 10A is a relational diagram showing a relationship between at least one input signal IN' and components thereof according to some embodiments of the present disclosure. FIG. 10B is a schematic diagram of a motorized RF assembly dial etch tuning according to some embodiments of the present disclosure. With reference to FIG. 10A and FIG. 10B, in some embodiments, the input signal IN' may include input parameters different from those of the input signal IN due to different types of etch tuning used in the etching tool 5. For example, the at least one input signal IN' includes at least one set of timing parameters TM, wafer size parameters WS, and motorized radial assembly dial parameters MRAD. As shown in FIG. 10B, in some embodiments, motorized radial assembly dial etch tuning may be used for overall offset mapping by adjusting the height and position of the ion source, so as to control the ion source controller board to point toward a center region of the wafer 20 depicted in FIG. 3, for example. In some embodiments, motorized radial assembly dial etch tuning in the etching tool 5 may be controlled by stepping motors in a range of 0 to 12 degrees tilt clockwise in the azimuth direction with a resolution of 0.1 degrees. It should be noted that, in some embodiments, the parameter sets of the input signals IN or IN' may include both divider capacitance parameters DCP and motorized radial assembly dial parameters MRAD for controlling both divider capacitor etch tuning and motorized radial assembly dial etch tuning of the etching tool 5.

Figure 11:
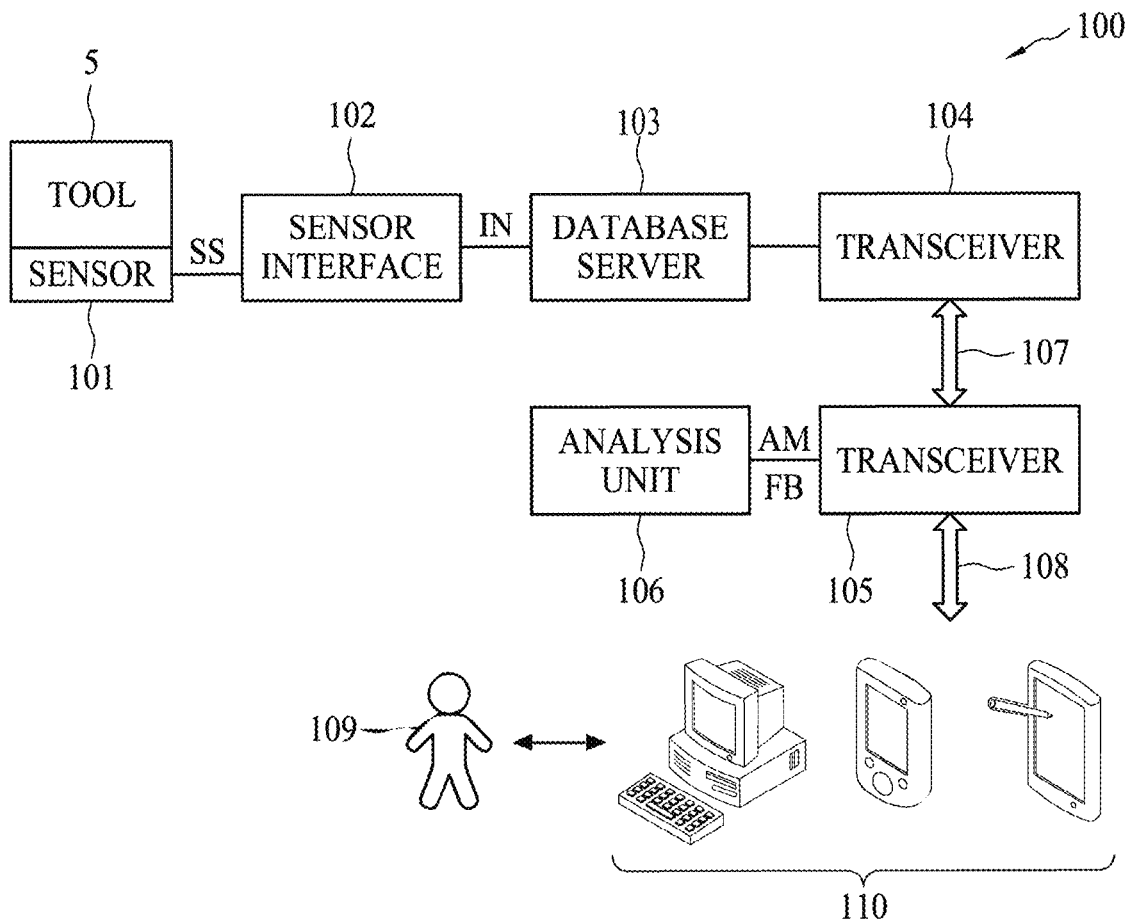
FIG. 11 is a block diagram depicting a user of a system for controlling semiconductor manufacturing equipment according to some embodiments of the present disclosure.
Figure 12:
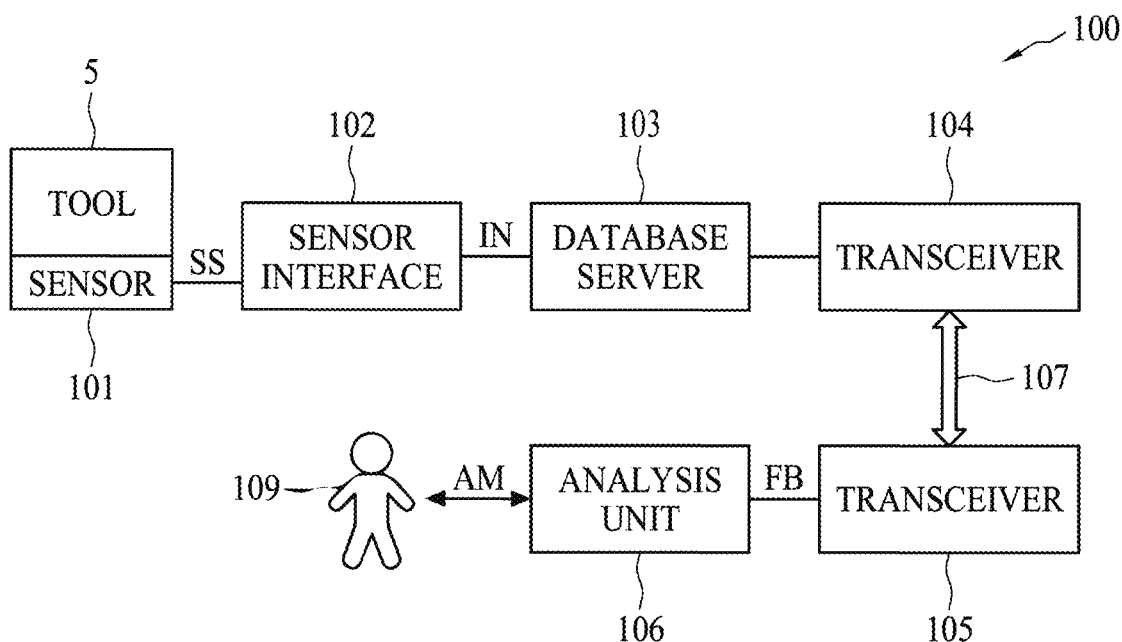
FIG. 12 is a block diagram depicting a user of a system for controlling semiconductor manufacturing equipment according to some embodiments of the present disclosure.
Figure 13:
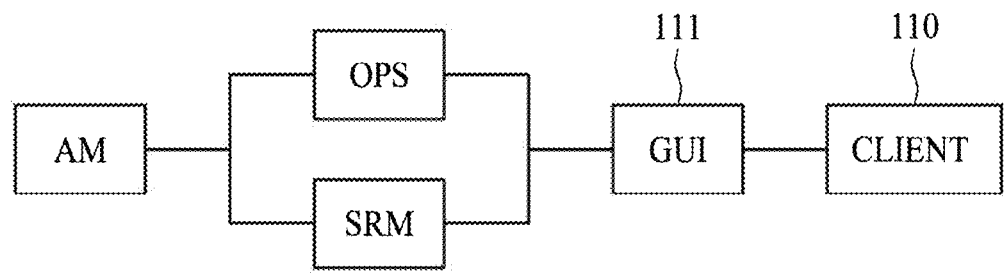
FIG. 13 is a relational diagram showing a relationship between an alert signal and components thereof according to some embodiments of the present disclosure.

In some embodiments, the message and tuning subsystem 52 generates the alert signal AM according to the optimal parameter set OPS and the simulated result map SRM from the calculation subsystem 51. In some embodiments, the alert signal AM may be sent to a user of the etching tool 5. FIG. 11 and FIG. 12 are block diagrams depicting a user 109 of the system 100 for controlling the etching tool 5 according to some embodiments of the present disclosure. FIG. 13 is a relational diagram showing a relationship between the alert signal AM and components thereof according to some embodiments of the present disclosure. With reference to FIG. 6 and FIG. 11, in some embodiments, the message and tuning subsystem 52 may transmit the alert signal AM to the user 109 through a network link 108 established between the second transceiver 105 and a client system 110. As shown in FIG. 11, the client system 110 may be, for example, a desktop computer, a notebook computer, a smart phone, a tablet computer, or the like capable of displaying the alert signal AM to the user 109. For instance, as shown in FIG. 13, the contents of the alert signal AM, which may include the optimal parameter set OPS and the simulated result map SRM, may be presented in a graphical user interface (GUI) 111 on the client system 110. The network link 108 may be any suitable type of network link based on wired or wireless technology known in the art, including but not limited to infrared, optical, or radio communication means. The alert signal AM may be transmitted to the client system 110 via electronic mail, instant messaging applications, or the like. The network links 107 and 108 may be part of a same network or different networks. The network links 107 and 108 may be part of an intranet, an extranet, an ad hoc network, a virtual private network (VPN), a local area network (LAN), a wireless LAN (WLAN), a wireless WAN (WWAN), a wide area network (WAN), a metropolitan area network (MAN), a portion of the Internet, a portion of the Public Switched Telephone Network (PSTN), a cellular telephone network, or a combination of two or more of these. In some embodiments, as shown in FIG. 12, the alert signal AM may also be directly supplied and displayed by the analysis unit 106 to the user 109. In some embodiments, the alert signal AM gives the user 109 advanced warning regarding the status of process parameters of the etching tool 5 and whether automated tuning processes are scheduled.

Figure 14:
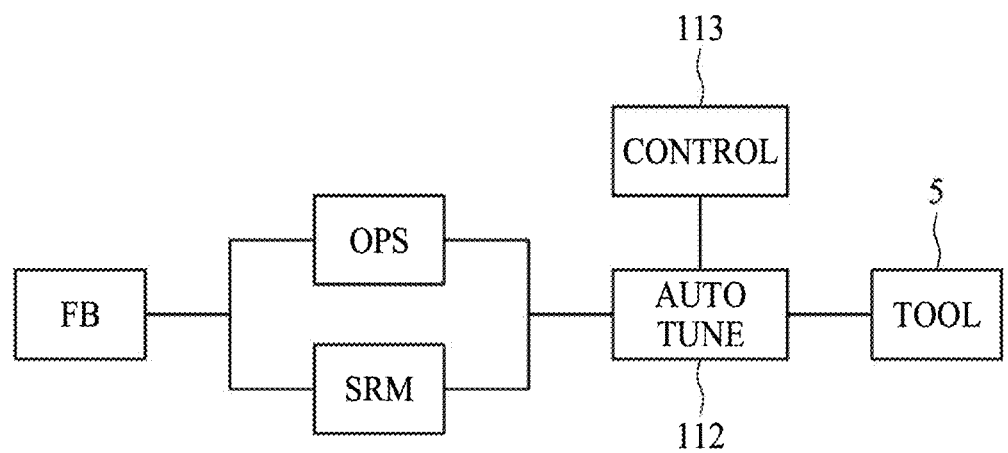
FIG. 14 is a relational diagram showing a relationship between a feedback signal and components thereof according to some embodiments of the present disclosure.

FIG. 14 is a relational diagram showing a relationship between the feedback signal FB and components thereof according to some embodiments of the present disclosure. With reference to FIG. 11 and FIG. 14, in some embodiments, when the feedback signal FB is transmitted to the etching tool 5 for an automated tuning process 112, the etching tool 5 is automatically tuned according to the optimized predicted results of the optimal parameter set OPS and the simulated result map SRM. For instance, process parameters, including but not limited to timing parameters TM, wafer size parameters WS, divider capacitance parameters DCP, and/or motorized radial assembly dial parameters, may be automatically adjusted run-to-run on the etching tool 5 with reference to the optimized predicted results. It should be noted that the feedback signal FB may be used directly by the etching tool 5 for the automated tuning process 112, or the feedback signal FB may be transmitted to a separate controller 113 to control the automated tuning process 112 of the etching tool 5.

Figure 15:
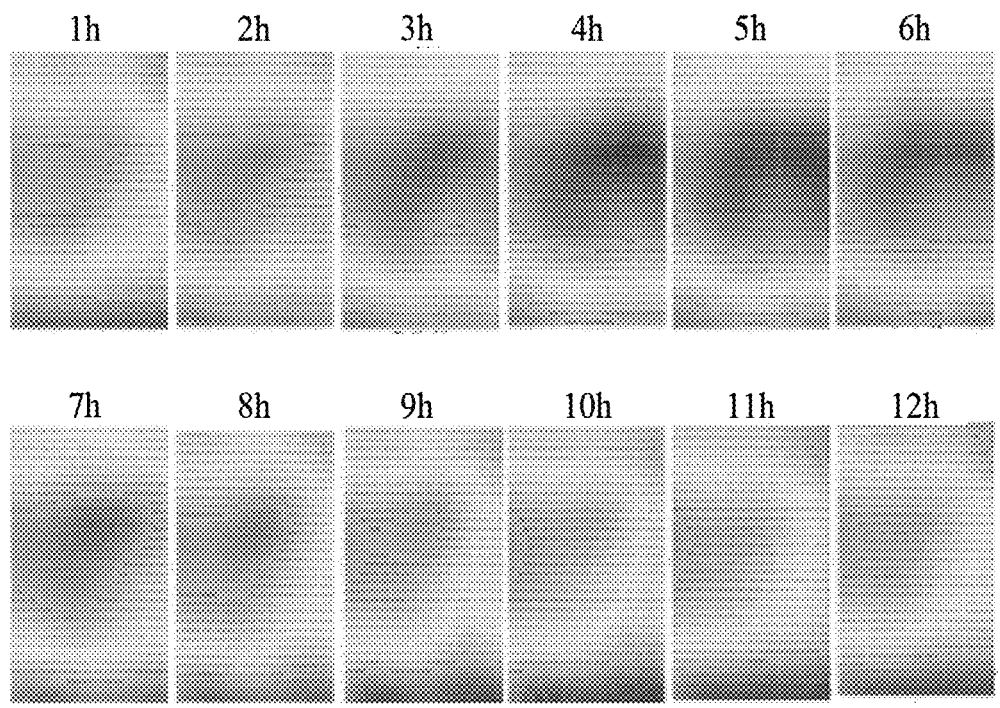
FIG. 15 is a schematic view of an example of a simulated result map according to some embodiments of the present disclosure.

FIG. 15 is a schematic view of an example of the simulated result map SRM according to some embodiments of the present disclosure. With reference to FIG. 15, the simulated result map SRM simulates etch hot zones at various time points. In some embodiments, the user 109 may view the simulated result map SRM on the client system 110 in the GUI 111 that also displays the optimal parameter set OPS, for example. Moreover, the simulated result map SRM may be used as a reference in the automated tuning process 112 of the etching tool 5.

Figure 16:
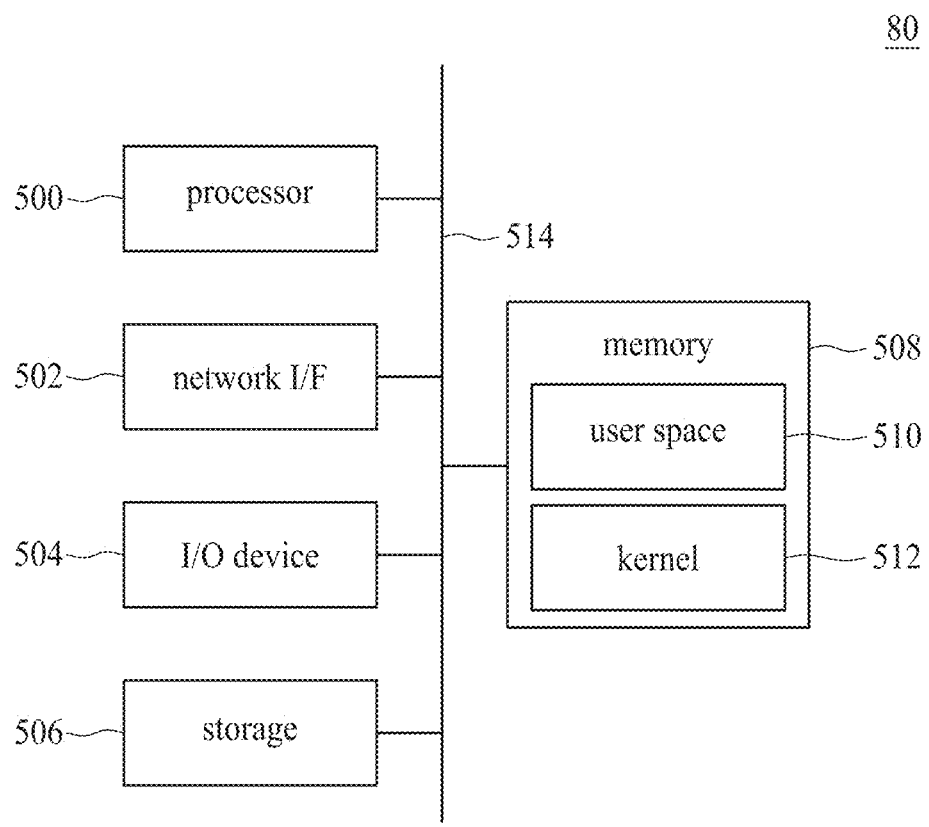
FIG. 16 is a block diagram of a computer system according to some embodiments of the present disclosure.

It should be noted that one or more of the tools, subsystems, methods, or operations described in the present disclosure may be realized by a computer system including instructions operable when executed by one or more processors of the computer system. For example, the analysis unit 106 and a method 600 described later in the present disclosure may be implemented by a computer system depicted in FIG. 16. FIG. 16 is a block diagram of a computer system 80 according to some embodiments of the present disclosure. With reference to FIG. 16, the computer system 80 may include one or more processors 500, a network interface (I/F) 502, a storage device 506, a memory 508, and an input/output (I/O) device 504 communicatively coupled via a bus 514 or other interconnection communication mechanism. The memory 508 includes, in some embodiments, a random access memory (RAM), other dynamic storage device, read-only memory (ROM), or other static storage device, coupled to the bus 514 for storing data or instructions to be executed by the one or more processors 500, and the memory 508 may include a kernel 512, a user space 510, portions of the kernel or the user space, and components thereof. The memory 508 is also used, in some embodiments, for storing temporary variables or other intermediate information during execution of instructions to be executed by the one or more processors 500.

In some embodiments, the storage device 506 is coupled to the bus 514 for transferring data or instructions to, for example, the kernel 512, the user space 510, etc. In some embodiments, the operations and functionalities are realized as functions of a program stored in the storage device 506, which may include one or more computer-readable non-transitory storage media coupled to the one or more processors 500. Examples of the computer-readable non-transitory storage media include, but are not limited to, external/removable or internal/built-in storage or memory units, e.g., one or more of an optical disk, such as a DVD, a magnetic disk, such as a hard disk, a semiconductor memory, such as a ROM, a RAM, a memory card, and the like. In some embodiments, the computer-readable non-transitory storage media of the storage device 506 includes instructions operable when executed by the one or more processors 500 to cause the system 100 to receive the at least one input signal IN from the database server DS and perform a comparison process to generate a data signal DS; receive the data signal DS from the front-end subsystem 50, wherein the calculation subsystem 51 performs an AI analytical process to generate an optimal parameter set OPS and a simulated result map SRM according to the data signal; generate an alert signal AM and a feedback signal FB according to the optimal parameter set OPS and the simulated result map SRM; and transmit the alert message AM to a user 109 of the semiconductor manufacturing equipment. In some embodiments, the system 100 performs extract-transform-load (ETL) services, compares the at least one input signal IN to at least one threshold value THR, and generates the data signal DS according to whether the at least one input signal IN is within a range R of the at least one threshold value THR, or whether the at least one input signal IN exceeds the threshold value THR. In some embodiments, the optimal parameter set OPS and the simulated result map SRM are generated according to the data signal DS by extracting an input parameter set IPS, calculating one or more height, depth, distance, and/or mask values at each data point DP, performing a statistical model prediction for each data point DP, and determining a predicted result PR. In some embodiments, the at least one input signal IN includes at least one set of timing parameters TM, wafer size parameters WS, and divider capacitance parameters DCP. In some embodiments, the at least one input signal IN comprises at least one set of timing parameters TM, wafer size parameters WS, and motorized radial assembly dial parameters MRAD. In some embodiments, the system 100 transmits the feedback signal FB for an automated tuning process 112 of the semiconductor manufacturing equipment according to the optimal parameter set OPS and the simulated result map SRM. In some embodiments, the semiconductor manufacturing equipment includes one or more etching tools 5.

In some embodiments, the I/O device 504 includes an input device, an output device, or a combined input/output device for enabling user interaction with the analysis unit 106. An input device includes, for example, a keyboard, keypad, mouse, trackball, trackpad, or cursor direction keys for communicating information and commands to the processor 500. An output device includes, for example, a display, a printer, a voice synthesizer, etc. for communicating information to a user. In some embodiments, one or more operations or functionalities of the tools, subsystems, and methods described in the present disclosure are realized by the one or more processors 500 of the computer system 80, which is programmed for performing such operations and providing such functionalities. One or more of the memory 508, the network I/F 502, the storage device 506, the I/O device 504, and the bus 514 are operable to receive instructions, data, design rules, netlists, layouts, models and other parameters for processing by the processor 500. In some embodiments, one or more of the operations and functionalities of the tools, subsystems, and methods described in the present disclosure may be implemented by specifically configured hardware (e.g., by one or more application specific integrated circuits (ASICs)) separate from or in lieu of the processor 500. Some embodiments incorporate more than one of the described operations or functionalities in a single ASIC.

Figure 17:
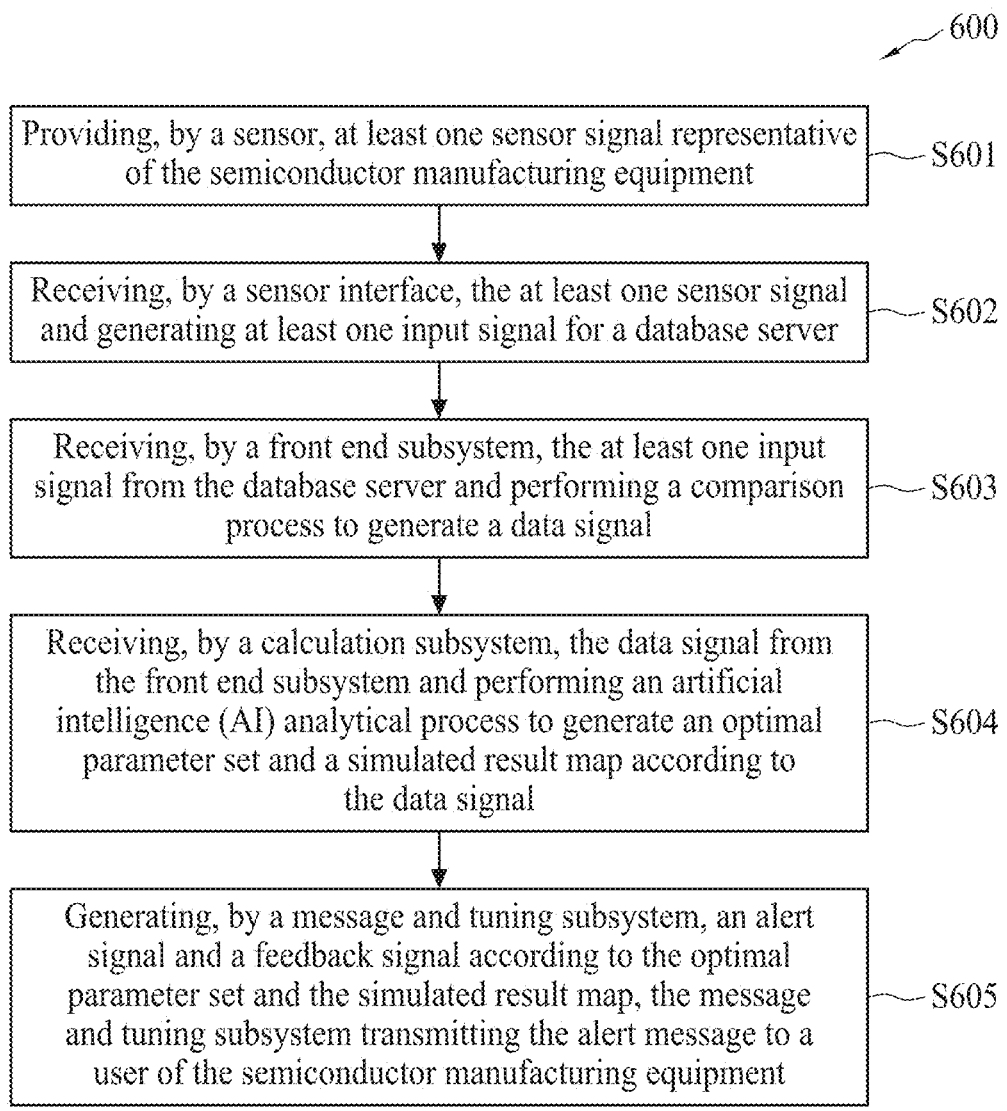
FIG. 17 is a flow diagram of a method for controlling semiconductor manufacturing equipment according to some embodiments of the present disclosure.

FIG. 17 is a flow diagram of a method 600 for controlling semiconductor manufacturing equipment according to some embodiments of the present disclosure. In some embodiments, the method 600 may be implemented by the system 100 depicted in FIG. 2 to FIG. 8, and the method 600 may also be realized by the computer system 80 depicted in FIG. 16. With reference to FIG. 17, the method 600 for controlling the semiconductor manufacturing equipment (e.g., the etching tool 5) includes: providing, by the sensor 101, at least one sensor signal SS representative of the semiconductor manufacturing equipment (Step S601); receiving, by the sensor interface 102, the at least one sensor signal SS and generating the at least one input signal IN for the database server 103 (Step S602); receiving, by the front-end subsystem 50, the at least one input signal IN from the database server 103 and performing a comparison process to generate a data signal DS (Step S603); receiving, by the calculation subsystem 51, the data signal DS from the front-end subsystem 50 and performing an artificial intelligence (AI) analytical process to generate the optimal parameter set OPS and the simulated result map SRM according to the data signal DS (Step S604); and generating, by the message and tuning subsystem 52, the alert signal AM and the feedback signal FB according to the optimal parameter set OPS and the simulated result map SRM, wherein the message and tuning subsystem 52 transmits the alert message AM to the user 109 of the semiconductor manufacturing equipment (Step S605).

Figure 18:
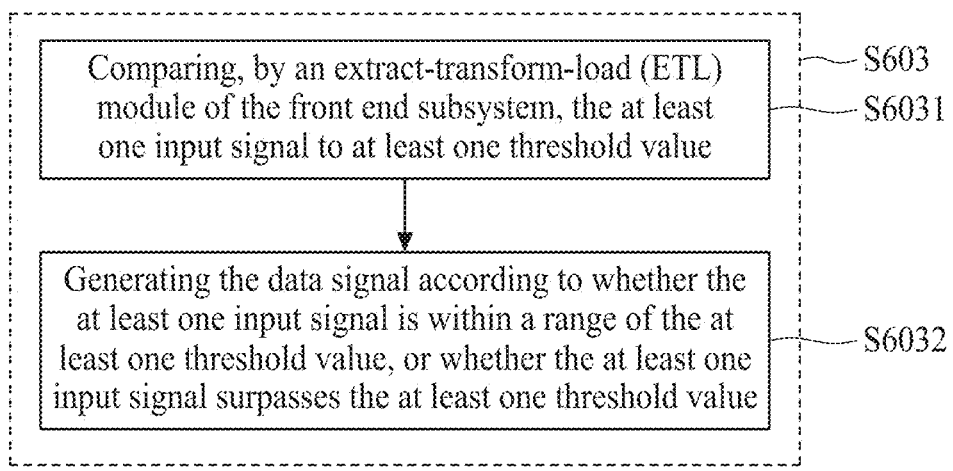
FIG. 18 is a flow diagram of a step in a method for controlling semiconductor manufacturing equipment according to some embodiments of the present disclosure.

FIG. 18 is a flow diagram of the Step S603 in the method 600 according to some embodiments of the disclosure. In some embodiments, the method 600 further includes comparing, by the extract-transform-load (ETL) module 25 of the front-end subsystem 50, the at least one input signal IN to the at least one threshold value THR (Step S6031) and generating the data signal DS according to whether the at least one input signal IN is within a range R of the at least one threshold value THR, or whether the at least one input signal IN exceeds the at least one threshold value THR (Step S6032).

Figure 19:
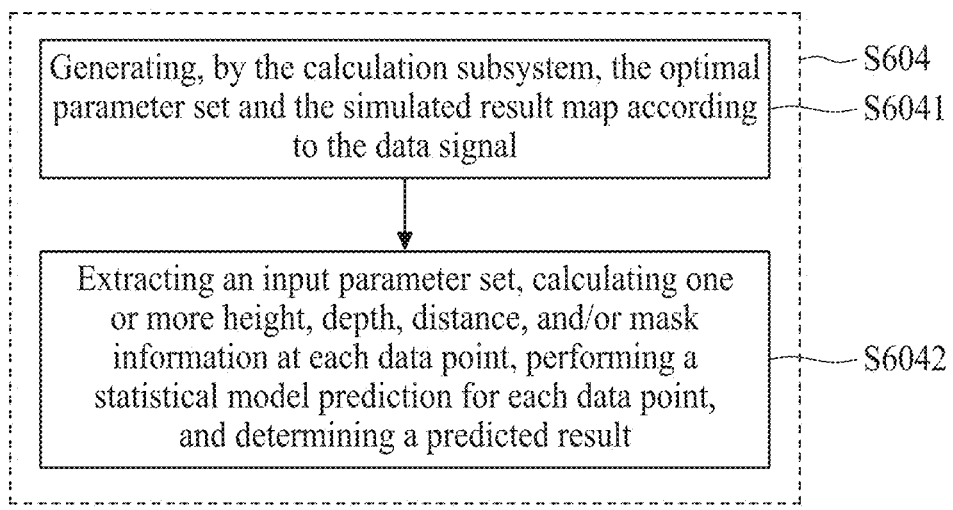
FIG. 19 is a flow diagram of a step in a method for controlling semiconductor manufacturing equipment according to some embodiments of the present disclosure.

FIG. 19 is a flow diagram of the Step S604 in the method 600 according to some embodiments of the disclosure. In some embodiments, the method 600 further includes generating, by the calculation subsystem 51, the optimal parameter set OPS and the simulated result map SRM according to the data signal DS (Step S6041) by extracting the input parameter set IPS, calculating one or more height, depth, distance, and/or mask values at each data point DP, performing the statistical model prediction for each data point DP, and determining the predicted result PR (Step S6042).

In some embodiments, the at least one input signal IN includes at least one set of timing parameters TM, wafer size parameters WS, and divider capacitance parameters DCP.

In some embodiments, the at least one input signal IN includes at least one set of timing parameters TM, wafer size parameters WS, and motorized radial assembly dial parameters MRAD.

Figure 20:
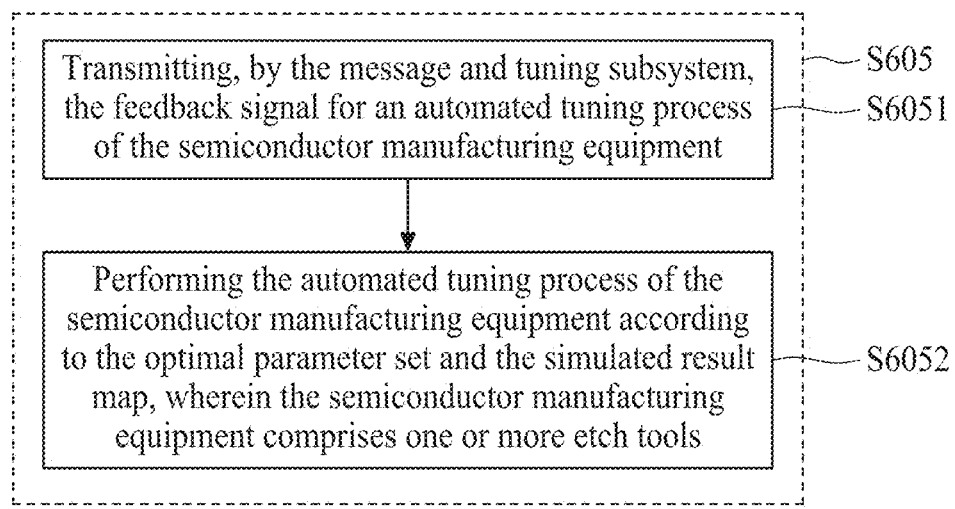
FIG. 20 is a flow diagram of a step in a method for controlling semiconductor manufacturing equipment according to some embodiments of the present disclosure.

FIG. 20 is a flow diagram of the Step S605 in the method 600 according to some embodiments of the disclosure. In some embodiments, the method 600 further includes transmitting, by the message and tuning subsystem 52, the feedback signal FB for the automated tuning process of the semiconductor manufacturing equipment (Step S6051); and performing the automated tuning process of the semiconductor manufacturing equipment according to the optimal parameter set OPS and the simulated result map SRM, wherein the semiconductor manufacturing equipment includes one or more etching tools 5 (Step S6052).

Accordingly, the system 100 and the method 600 for controlling semiconductor manufacturing equipment provide automated AI analytical subsystems and processes capable of predicting the optimized process parameters of equipment such as the etching tool 5. Due to the analysis unit 106, which includes the intelligent calculation subsystem 51 and the message and tuning subsystem 52, operators of the etching tool 5 can monitor and optimize the process parameters of the equipment and receive advanced warning regarding the status of the process parameters. Moreover, due to the automated parameter optimization and equipment tuning of the system 100 and the method 600, human error, processing time, and defective products can be minimized.

One aspect of the present disclosure provides a system for controlling semiconductor manufacturing equipment, wherein the system includes a sensor, a sensor interface, and an analysis unit. The sensor provides at least one sensor signal representative of the semiconductor manufacturing equipment. The sensor interface receives the at least one sensor signal and generates at least one input signal for a database server. The analysis unit includes a front-end subsystem, a calculation subsystem, and a message and tuning subsystem. The front-end subsystem receives the at least one input signal from the database server and performs a comparison process to generate a data signal. The calculation subsystem receives the data signal from the front-end subsystem, wherein the calculation subsystem performs an artificial intelligence (AI) analytical process to generate an optimal parameter set and a simulated result map according to the data signal. The message and tuning subsystem generates an alert signal and a feedback signal according to the optimal parameter set and the simulated result map, wherein the message and tuning subsystem transmits the alert message to a user of the semiconductor manufacturing equipment.

Another aspect of the present disclosure provides a system for monitoring semiconductor manufacturing equipment, wherein the system includes a sensor, a sensor interface, one or more processors, and one or more computer-readable non-transitory storage media. The sensor provides at least one sensor signal representative of the semiconductor manufacturing equipment. The sensor interface receives the at least one sensor signal and generates at least one input signal for a database server. The one or more computer-readable non-transitory storage media are coupled to the one or more processors and include instructions operable when executed by the one or more processors to cause the system to: receive the at least one input signal from the database server and perform a comparison process to generate a data signal; receive the data signal from the front-end subsystem, wherein the calculation subsystem performs an artificial intelligence (AI) analytical process to generate an optimal parameter set and a simulated result map according to the data signal; generate an alert signal and a feedback signal according to the optimal parameter set and the simulated result map; and transmit the alert message to a user of the semiconductor manufacturing equipment.

Another aspect of the present disclosure provides a method for controlling semiconductor manufacturing equipment, wherein the method includes: providing, by a sensor, at least one sensor signal representative of the semiconductor manufacturing equipment; receiving, by a sensor interface, the at least one sensor signal and generating at least one input signal for a database server; receiving, by a front-end subsystem, the at least one input signal from the database server and performing a comparison process to generate a data signal; receiving, by a calculation subsystem, the data signal from the front-end subsystem, and performing an artificial intelligence (AI) analytical process to generate an optimal parameter set and a simulated result map according to the data signal; and generating, by a message and tuning subsystem, an alert signal and a feedback signal according to the optimal parameter set and the simulated result map, wherein the message and tuning subsystem transmits the alert message to a user of the semiconductor manufacturing equipment.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A system for controlling semiconductor manufacturing equipment, the system comprising:
    a sensor providing at least one sensor signal representative of the semiconductor manufacturing equipment;
    a sensor interface receiving the at least one sensor signal and generating at least one input signal for a database server; and
    an analysis unit comprising:
        a front-end subsystem receiving the at least one input signal from the database server and performing a comparison process to generate a data signal;
        a calculation subsystem receiving the data signal from the front-end subsystem, wherein the calculation subsystem performs an artificial intelligence (AI) analytical process to generate an optimal parameter set and a simulated result map according to the data signal; and
        a message and tuning subsystem generating an alert signal and a feedback signal according to the optimal parameter set and the simulated result map, wherein the message and tuning subsystem transmits the alert message to a user of the semiconductor manufacturing equipment.

2. The system of claim 1, wherein the front-end subsystem comprises an extract-transform-load (ETL) module for comparing the at least one input signal to at least one threshold value and generating the data signal according to whether the at least one input signal is within a range of the at least one threshold value, or whether the at least one input signal exceeds the at least one threshold value.

3. The system of claim 1, wherein the calculation subsystem generates the optimal parameter set and the simulated result map according to the data signal by extracting an input parameter set, calculating one or more height, depth, distance, and/or mask values at each data point, performing a statistical model prediction for each data point, and determining a predicted result.

4. The system of claim 1, wherein the at least one input signal comprises at least one set of timing, wafer size, and capacitance parameters.

5. The system of claim 1, wherein the at least one input signal comprises at least one set of timing, wafer size, and radial assembly dial parameters.

6. The system of claim 1, wherein the message and tuning subsystem transmits the feedback signal for an automated tuning process of the semiconductor manufacturing equipment according to the optimal parameter set and the simulated result map.

7. The system of claim 1, wherein the semiconductor manufacturing equipment comprises one or more etching tools.

8. A system for controlling semiconductor manufacturing equipment, wherein the system comprises:
    a sensor providing at least one sensor signal representative of the semiconductor manufacturing equipment;
    a sensor interface receiving the at least one sensor signal and generating at least one input signal for a database server;
    one or more processors; and
    one or more computer-readable non-transitory storage media coupled to the one or more processors and comprising instructions operable when executed by the one or more processors to cause the system to:
        receive the at least one input signal from the database server and perform a comparison process to generate a data signal;
        receive the data signal from a front-end subsystem, wherein a calculation subsystem performs an artificial intelligence (AI) analytical process to generate an optimal parameter set and a simulated result map according to the data signal; and
        generate an alert signal and a feedback signal according to the optimal parameter set and the simulated result map and transmit the alert message to a user of the semiconductor manufacturing equipment.

9. The system of claim 8, wherein the one or more computer-readable non-transitory storage media further comprise instructions operable when executed by the one or more processors to cause the system to perform extract-transform-load (ETL) services, compare the at least one input signal to at least one threshold value, and generate the data signal according to whether the at least one input signal is within a range of the at least one threshold value, or whether the at least one input signal exceeds the threshold value.

10. The system of claim 8, wherein the optimal parameter set and the simulated result map are generated according to the data signal by extracting an input parameter set, calculating one or more height, depth, distance, and/or mask values at each data point, performing a statistical model prediction for each data point, and determining a predicted result.

11. The system of claim 8, wherein the at least one input signal comprises at least one set of timing, wafer size, and capacitance parameters.

12. The system of claim 8, wherein the at least one input signal comprises at least one set of timing, wafer size, and radial assembly dial parameters.

13. The system of claim 8, wherein the one or more computer-readable non-transitory storage media further comprise instructions operable when executed by the one or more processors to cause the system to transmit the feedback signal for an automated tuning process of the semiconductor manufacturing equipment according to the optimal parameter set and the simulated result map.

14. The system of claim 8, wherein the semiconductor manufacturing equipment comprises one or more etching tools.

15. A method for controlling semiconductor manufacturing equipment, the method comprising:
    providing, by a sensor, at least one sensor signal representative of the semiconductor manufacturing equipment;
    receiving, by a sensor interface, the at least one sensor signal and generating at least one input signal for a database server;
    receiving, by a front-end subsystem, the at least one input signal from the database server and performing a comparison process to generate a data signal;
    receiving, by a calculation subsystem, the data signal from the front-end subsystem and performing an artificial intelligence (AI) analytical process to generate an optimal parameter set and a simulated result map according to the data signal; and
    generating, by a message and tuning subsystem, an alert signal and a feedback signal according to the optimal parameter set and the simulated result map, wherein the message and tuning subsystem transmits the alert message to a user of the semiconductor manufacturing equipment.

16. The method of claim 15, further comprising comparing, by an extract-transform-load (ETL) module of the front-end subsystem, the at least one input signal to at least one threshold value and generating the data signal according to whether the at least one input signal is within a range of the at least one threshold value, or whether the at least one input signal exceeds the at least one threshold value.

17. The method of claim 15, further comprising generating, by the calculation subsystem, the optimal parameter set and the simulated result map according to the data signal by extracting an input parameter set, calculating one or more height, depth, distance, and/or mask values at each data point, performing a statistical model prediction for each data point, and determining a predicted result.

18. The method of claim 15, wherein the at least one input signal comprises at least one set of timing, wafer size, and capacitance parameters.

19. The method of claim 15, wherein the at least one input signal comprises at least one set of timing, wafer size, and radial assembly dial parameters.

20. The method of claim 15, further comprising transmitting, by the message and tuning subsystem, the feedback signal for an automated tuning process of the semiconductor manufacturing equipment according to the optimal parameter set and the simulated result map, wherein the semiconductor manufacturing equipment comprises one or more etching tools.

* * * * *